(12) United States Patent
Ohira et al.

(10) Patent No.: US 10,262,816 B2
(45) Date of Patent: Apr. 16, 2019

(54) KEY INPUT APPARATUS SENSING TOUCH AND PRESSURE AND ELECTRONIC APPARATUS HAVING THE SAME

(71) Applicant: CASIO COMPUTER CO., LTD., Shibuya-ku, Tokyo (JP)

(72) Inventors: Hiroki Ohira, Kiyose (JP); Yoshihisa Matsumoto, Ome (JP)

(73) Assignee: CASIO COMPUTER CO., LTD., Tokyo (JP)

(*) Notice: Subject to any disclaimer, the term of this patent is extended or adjusted under 35 U.S.C. 154(b) by 0 days.

(21) Appl. No.: 15/369,265

(22) Filed: Dec. 5, 2016

(65) Prior Publication Data
US 2017/0178838 A1 Jun. 22, 2017

(30) Foreign Application Priority Data

Dec. 18, 2015 (JP) ................................. 2015-247182
Sep. 30, 2016 (JP) ................................. 2016-192554
Oct. 28, 2016 (JP) ................................. 2016-211534

(51) Int. Cl.
*H01H 13/64* (2006.01)
*H03K 17/96* (2006.01)
(Continued)

(52) U.S. Cl.
CPC ............ *H01H 13/64* (2013.01); *H01H 13/14* (2013.01); *H01H 13/70* (2013.01); *H01H 13/7006* (2013.01); *H03K 17/962* (2013.01); *H03K 17/9622* (2013.01); *G06F 3/0202* (2013.01); *H01H 2003/0293* (2013.01); *H01H 2225/002* (2013.01); *H01H 2225/03* (2013.01); *H03K 2217/96054* (2013.01)

(58) Field of Classification Search
CPC .............................. G06F 3/0213; G06F 3/0202
See application file for complete search history.

(56) References Cited

U.S. PATENT DOCUMENTS 6,259,045 B1 * 7/2001 Imai ....................... H01H 13/70
200/5 A
2009/0091536 A1 * 4/2009 Callaghan ............... G06F 3/023
345/168
(Continued)

FOREIGN PATENT DOCUMENTS

JP 2002055766 A 2/2002
JP 2006253000 A 9/2006
(Continued)

*Primary Examiner* — Sepehr Azari
(74) *Attorney, Agent, or Firm* — Holtz, Holtz & Volek PC (57) ABSTRACT

According to one embodiment, there is provided an input apparatus comprising a key that is displaceable along a direction; a first detecting circuit that comprises an electrostatic capacitance sensor that detects a variation of an electrostatic capacitance caused by a contact or a proximity of a pressing body with the key; and a second detecting circuit that comprises a first electrode, the second detecting circuit detecting an electric connection of the first electrode to a second electrode that is displaced along the direction as the key is displaced, wherein the input apparatus switches a detecting status thereof exclusively between a first detecting status and a second detecting status to each other in accordance with a displacement variation of the key.

11 Claims, 9 Drawing Sheets

(51) Int. Cl.
    *G06F 3/02*         (2006.01)
    *H01H 13/14*     (2006.01)
    *H01H 3/02*       (2006.01)
    *H01H 13/70*     (2006.01)

(56) References Cited

U.S. PATENT DOCUMENTS

| | | | |
|---|---|---|---|
| 2010/0123676 A1 | 5/2010 | Kirkup | |
| 2010/0148995 A1* | 6/2010 | Elias | G06F 3/0202 |
| | | | 341/22 |
| 2011/0298699 A1* | 12/2011 | Goto | G06F 3/0202 |
| | | | 345/156 |
| 2013/0063285 A1* | 3/2013 | Elias | G06F 3/0213 |
| | | | 341/33 |
| 2014/0252883 A1* | 9/2014 | Dinh | H01H 13/06 |
| | | | 307/125 |

FOREIGN PATENT DOCUMENTS

| | | | |
|---|---|---|---|
| JP | 2008288142 A | 11/2008 | |
| JP | 2010074689 A | 4/2010 | |

* cited by examiner

| NO. | TOUCH INPUT PATTERN | SEARCH FLAG | FUNCTION |
|---|---|---|---|
| $P_{i1}$ | { 9, 5, 1 } | 1 | [%] |
| $P_{i2}$ | { 8, 5, 2 } | 1 | [M+] |
| $P_{i3}$ | { 7, 5, 3 } | 1 | [M−] |
| $P_{i4}$ | { 4, 5, 6 } | 1 | [MRC] |
| | | | |

KEY INPUT APPARATUS SENSING TOUCH AND PRESSURE AND ELECTRONIC APPARATUS HAVING THE SAME

CROSS-REFERENCE TO RELATED APPLICATION

This application is based upon and claims the benefit of priority from Japanese Patent Applications No. 2015-247182, filed Dec. 18, 2015; No. 2016-192554, filed Sep. 30, 2016; and No. 2016-211534, filed Oct. 28, 2016, the entire contents of all of which are incorporated herein by reference.

BACKGROUND OF THE INVENTION

1. Field of the Invention

The technical field relates to an input apparatus and an electronic apparatus.

2. Description of the Related Art

For example, as disclosed in Jpn. Pat. Appln. KOKAI Publication No. 2010-74689, there is conventionally known an electronic apparatus including an input apparatus. The input apparatus includes first detecting means for detecting a key which is touched, and second detecting means for detecting a key on which an operation of displacing a key state was executed.

Figure 3:
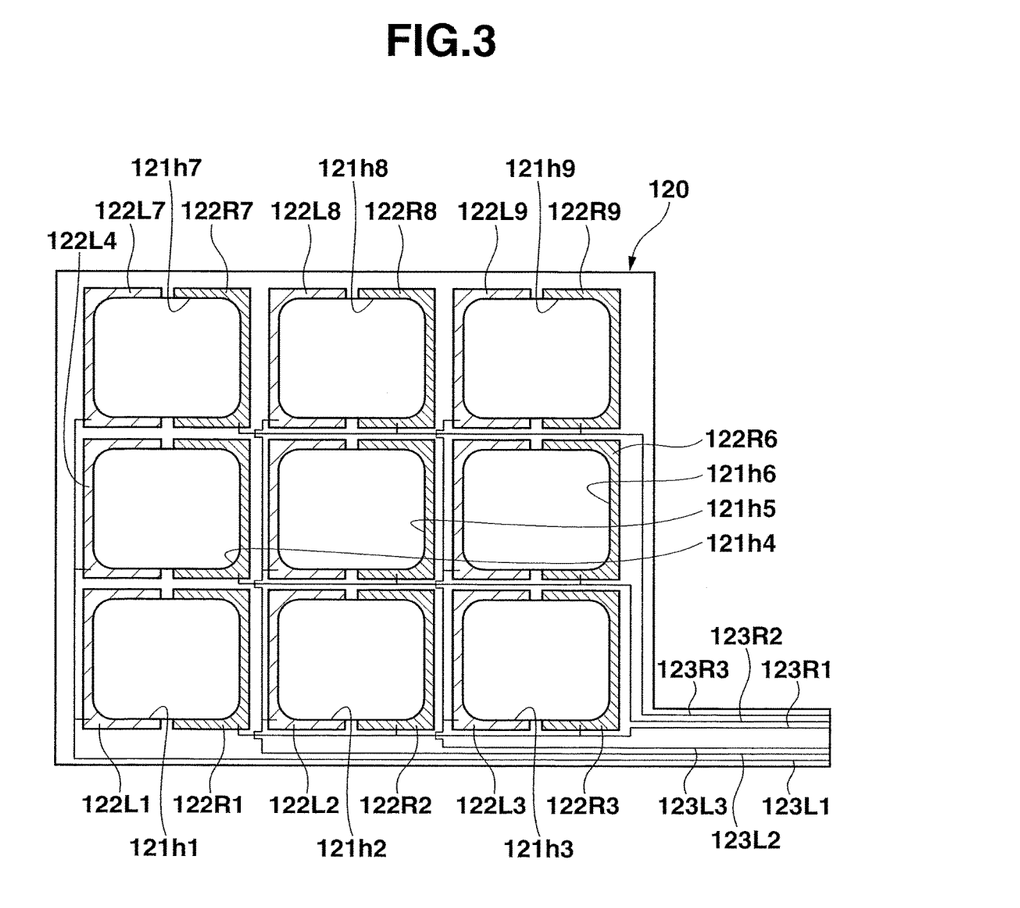
FIG. 3 is a transparent plan view illustrating a conductor pattern on a touch detection sheet 120 of the electronic calculator 10 according to the embodiment of the invention.

In the input apparatus of the conventional electronic apparatus, as a matter of course, when an operation of touching a key is executed, the touch operation is detected by the first detecting means. However, even when an operation of depressing the key is executed (see FIG. 3(C) of patent document 3), the touch operation is detected by the first detecting means. In other words, it was necessary to adopt such a configuration that even while the key is being displaced in the direction of key depression, a variation of an electrostatic capacitance caused by the key touch operation can be detected. Consequently, the degree of freedom was restricted at a time of designing an input apparatus which can detect both a touch operation on each key and a depression operation on each key.

BRIEF SUMMARY OF THE INVENTION

According to an aspect of the present invention, there is provided an input apparatus comprising: a key that is displaceable along a direction; a first detecting circuit that comprises an electrostatic capacitance sensor that detects a variation of an electrostatic capacitance caused by a contact or a proximity of a pressing body with the key; and a second detecting circuit that comprises a first electrode, the second detecting circuit detecting an electric connection of the first electrode to a second electrode that is displaced along the direction as the key is displaced, wherein the input apparatus switches a detecting status thereof exclusively between a first detecting status and a second detecting status to each other in accordance with a displacement variation of the key, the first detecting status being a status where the variation of the electrostatic capacitance is detected by the first detecting circuit and, at the same time, the electric connection is not detected by the second detecting circuit, the second detecting status being a status where the variation of the electrostatic capacitance is not detected by the first detecting circuit and, at the same time, the electric connection is detected by the second detecting circuit.

According to another aspect of the invention, there is provided an electronic apparatus comprising: an input apparatus; and a processor, wherein the input apparatus comprises: a key that is displaceable along a direction; a first detecting circuit that comprises an electrostatic capacitance sensor that detects a variation of an electrostatic capacitance caused by a contact or a proximity of a pressing body with the key; and a second detecting circuit that comprises a first electrode, the second detecting circuit detecting an electric connection of the first electrode to a second electrode that is displaced along the direction as the key is displaced, wherein the input apparatus switches a detecting status thereof exclusively between a first detecting status and a second detecting status to each other in accordance with a displacement variation of the key, the first detecting status being a status where the variation of the electrostatic capacitance is detected by the first detecting circuit and, at the same time, the electric connection is not detected by the second detecting circuit, the second detecting status being a status where the variation of the electrostatic capacitance is not detected by the first detecting circuit and, at the same time, the electric connection is detected by the second detecting circuit, and wherein the processor executes at least one function in accordance with detection results by the first detecting circuit and the second detecting circuit.

BRIEF DESCRIPTION OF THE SEVERAL VIEWS OF THE DRAWING

The components in the drawings are not necessarily scale relative to each other.

DETAILED DESCRIPTION OF THE PREFERRED EMBODIMENTS

To begin with, an embodiment of the present invention will be described with reference to FIG. 1 to FIG. 7.

Figure 1:
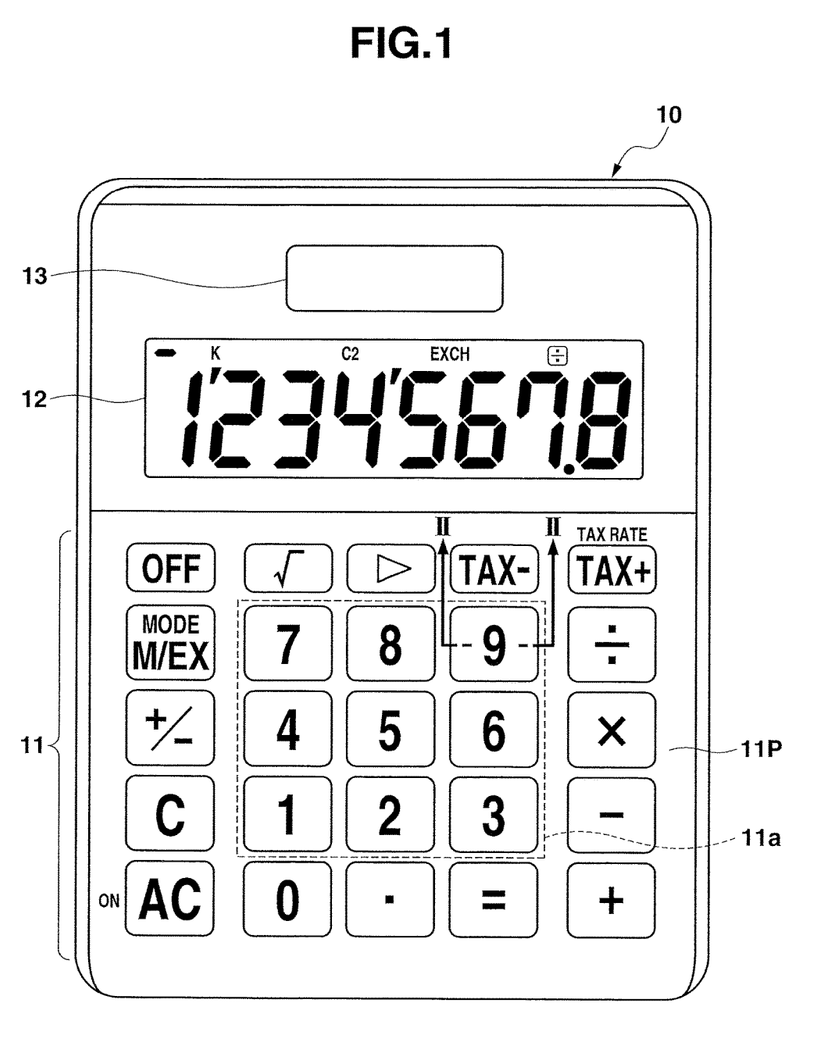
FIG. 1 is a plan view illustrating an electronic calculator 10 as an input apparatus according to an embodiment of the present invention.
Figure 2:
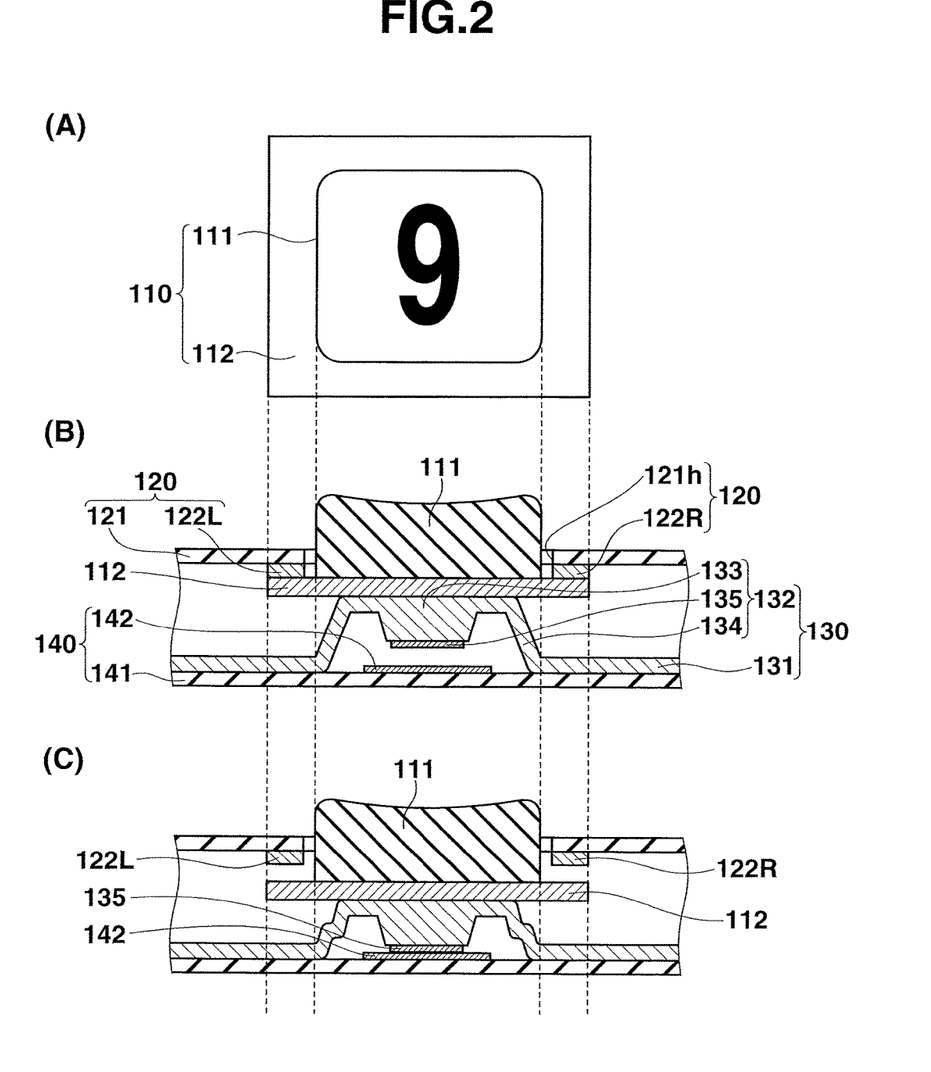
FIG. 2 is a view illustrating a numeric key 110 of an input section 11 of the electronic calculator 10 according to the embodiment of the invention, part (A) of FIG. 2 being a plan view of the numeric key 110, part (B) of FIG. 2 being a II-II cross-sectional view illustrating a key structure of the numeric key 110 at a touch operation detection time, and part (C) of FIG. 2 being a II-II cross-sectional view illustrating a key structure of the numeric key 110 at a stroke operation detection time.

FIG. 1 is a plan view illustrating an electronic calculator 10 as an input apparatus according to the embodiment of the invention. FIG. 2 is a view illustrating a numeric key 110 of an input section 11 of the electronic calculator 10 according to the embodiment of the invention, part (A) of FIG. 2 being a plan view of the numeric key 110, part (B) of FIG. 2 being a II-II cross-sectional view illustrating a key structure of the numeric key 110 at a touch operation detection time (first detecting status), and part (C) of FIG. 2 being a II-II cross-sectional view illustrating a key structure of the numeric key 110 at a stroke operation detection time (second detecting status).

As illustrated in FIG. 1, the electronic calculator 10 includes an input section 11, a display 12 and a solar cell panel 13. The input section 11 includes keys such as an all-clear key [AC], a clear key [C], a plus/minus switching key [+/−], numeric keys [0] to [9], and arithmetic keys [+], [−], [×], [÷] and [=]. Each of the keys is configured to be displaceable in a certain direction (a direction perpendicular to the drawing sheet of FIG. 1), and is a stroke key, the stroke of which is detectable. Of the numeric keys [0] to [9], nine numeric keys [1] to [9] 110 are arranged in a matrix of 3×3. In addition, these numeric keys [1] to [9] 110 function not only as the stroke keys, but also as touch keys.

As illustrated in the cross-sectional views of parts (B) and (C) of FIG. 2, a key structure of the input section 11 includes the numeric key 110, a touch detection sheet 120, a key urging sheet 130, and a substrate 140.

The numeric key 110 is formed of a material with electrical conductivity, such as a conductive metal. As illustrated in part (A) of FIG. 2, the numeric key 110 includes, in plan view, a key top 111 at a central part thereof, and a square-shaped collar portion 112 at a peripheral part thereof, the square-shaped collar portion 112 surrounding the four sides of the key top 111. In addition, a numeral, which is unique to this numeric key, is printed on an upper surface of the key top 111. In part (A) of FIG. 2, although the numeric key [9] 110 is illustrated and described, the other numeric keys [1] 110 to [8] 110 are the same as the numeric key [9] 110, except for the content of printing on the key top 111. In the description below in this specification, in some cases, each of the "numeric keys [1] to [9] 110" is referred to simply as "numeric key 110".

The touch detection sheet 120 includes an insulation sheet 121 and a conductor pattern (see FIG. 3). The insulation sheet 121 is provided with a plurality of holes 121h, through which the respective numeric keys 110 are inserted. The conductor pattern includes two touch detection electrodes 122R and 122L formed at least at positions at a peripheral edge of each hole 121h under the insulation sheet 121, these positions corresponding to two opposed sides of the square-shaped collar portion 112. The conductor pattern further includes wiring lines 123R and 123L which are connected to the touch detection electrodes 122R and 122L.

The key urging sheet 130 is formed of an elastic member of rubber or the like. The key urging sheet 130 includes a base portion 131 and a key pushing-up portion 132. The base portion 131 has, as a whole, a substantially rectangular shape in plan view. The key pushing-up portion 132 is formed in such a shape that a part overlapping each numeric key 110 in the substantially rectangular shape is raised upward (to a side on which each numeric key 110 is disposed relative to the key urging sheet 130). The key pushing-up portion 132 includes an abutment portion 133 which is disposed immediately under the numeric key 110, and a skirt portion 134 which deforms in accordance with a stroke operation of the numeric key 110 and causes such an elastic repulsive force as to urge upward the abutment portion 133 and numeric key 110. A counter-electrode 135 is provided on a lower surface (a surface facing an upper surface of the substrate 14) of the abutment portion 133.

The substrate 140 includes an insulative base portion 141, and electrodes, wiring lines, electronic components, etc. which are formed on an upper surface of the base portion 141. In particular, a stroke detection electrode (first electrode) 142 is provided on that part of the upper surface of the base portion 141, which is opposed to each counter-electrode 135 of the key urging sheet 130.

Referring to parts (B) and (C) of FIG. 2, a brief description is given of each key structure at a touch operation detection time and at a scroll operation detection time. As illustrated in part (B) of FIG. 2, a touch operation is detected in a state in which a stroll operation of the numeric key 110 is not executed. In this state, the key urging sheet 130 retains its original shape by the elastic repulsive force which the material of the key urging sheet 130 has. Thereby, the upper surface of the abutment portion 133 of the key pushing-up portion 132 abuts on the lower surface of the numeric key 110 (i.e. pushes the lower surface of the numeric key 110) and supports the lower surface of the numeric key 110, and puts the upper surfaces of the two opposed sides of the collar portion 112 in contact with the touch detection electrodes 122R and 122L of the touch detection sheet 120. The key top 111 is connected to one of electrostatic capacitance sensor which a touch detecting circuit (first detecting circuit) 211 (see FIG. 4) includes, via the collar portion 112 and the touch detection electrode 122R, and is connected to another of the electrostatic capacitance sensors which the touch detecting circuit 211 includes, via the collar portion 112 and the touch detection electrode 122L. A structure that comprises the key top 111, the collar portion 112, the touch detection electrodes 122R, 122L, and the touch detecting circuit 211 having the electrostatic capacitance sensors is, hereinafter, referred to as a touch operation detector 210.

On the other hand, if a user pushes, by a fingertip, the key top 111 against the elastic repulsive force of the key urging sheet 130, the numeric key 110 displaces downward along a stroke direction of the numeric key 110 (an up-and-down direction in part (C) of FIG. 2). If the stroke displacement variation of the numeric key 110 by this stroke operation (the amount of movement of the numeric key 110 in the up-and-down direction in parts (B) and (C) of FIG. 2) reaches a certain degree, the counter-electrode 135 of the key urging sheet 130 and the stroke detection electrode 142 of the substrate 140 come in contact with each other, as illustrated in part (C) of FIG. 2, and the stroke operation is detected. At this time, the collar portion 112 is spaced apart from the touch detection electrodes 122R and 122L, and an electric connection via these components between the key top 111 and the above-described two electrostatic capacitance sensors is released.

FIG. 3 is a transparent plan view illustrating the touch detection electrodes 122 and wiring lines 123 of the conductor pattern on the touch detection sheet 120 of the electronic calculator 10 according to the embodiment of the invention. In FIG. 3, the arrangement of the conductor pattern, as viewed from above the electronic calculator 10 (from the viewer side of the drawing sheet) is depicted as a transparent plan view. However, the actual conductor pattern is formed below the insulation sheet 121 (on the side where the key urging sheet 130 and substrate 140 are disposed relative to the insulation sheet 121). The touch detection sheet 120 includes a substantially rectangular key hole formation portion in which nine rectangular holes 121$h$1 to 121$h$9 are provided in a matrix of 3×3; a led-out wiring formation portion extending with a small width from a lower right part of the key hole formation portion; and an electrostatic capacitance sensor formation section (not shown) which is connected to a distal end of the led-out wiring formation portion and in which the electrostatic capacitance sensors are provided. In the description below in this specification, when a feature common to all holes is described, there is a case in which the individual holes are not distinguished and are referred to as "hole 121$h$".

At a peripheral edge of each hole 121$h$, two touch detection electrodes 122R and 122L are provided in a manner to surround this hole. The right-side touch detection electrode 122R has a right square bracket (]) shape in plan view, and is provided to come in contact with the entire length of the right side of the hole 121$h$ and with the right-side parts of the upper and lower sides of the hole 121$h$. The left-side touch detection electrode 122L has a left square bracket ([) shape in plan view, and is provided to come in contact with the entire length of the left side of the hole 121$h$ and with the left-side parts of the upper and lower sides of the hole 121$h$. The two touch detection electrodes 122R and 122L are spaced apart at mutually neighboring parts on the upper and lower sides of the hole 121$h$. The right-side touch detection electrode 122R is connected to one of the electrostatic capacitance sensors via the wiring line 123R, and the left-side touch detection electrode 122L is connected to another of the electrostatic capacitance sensors via the wiring line 123L.

Figure 4:
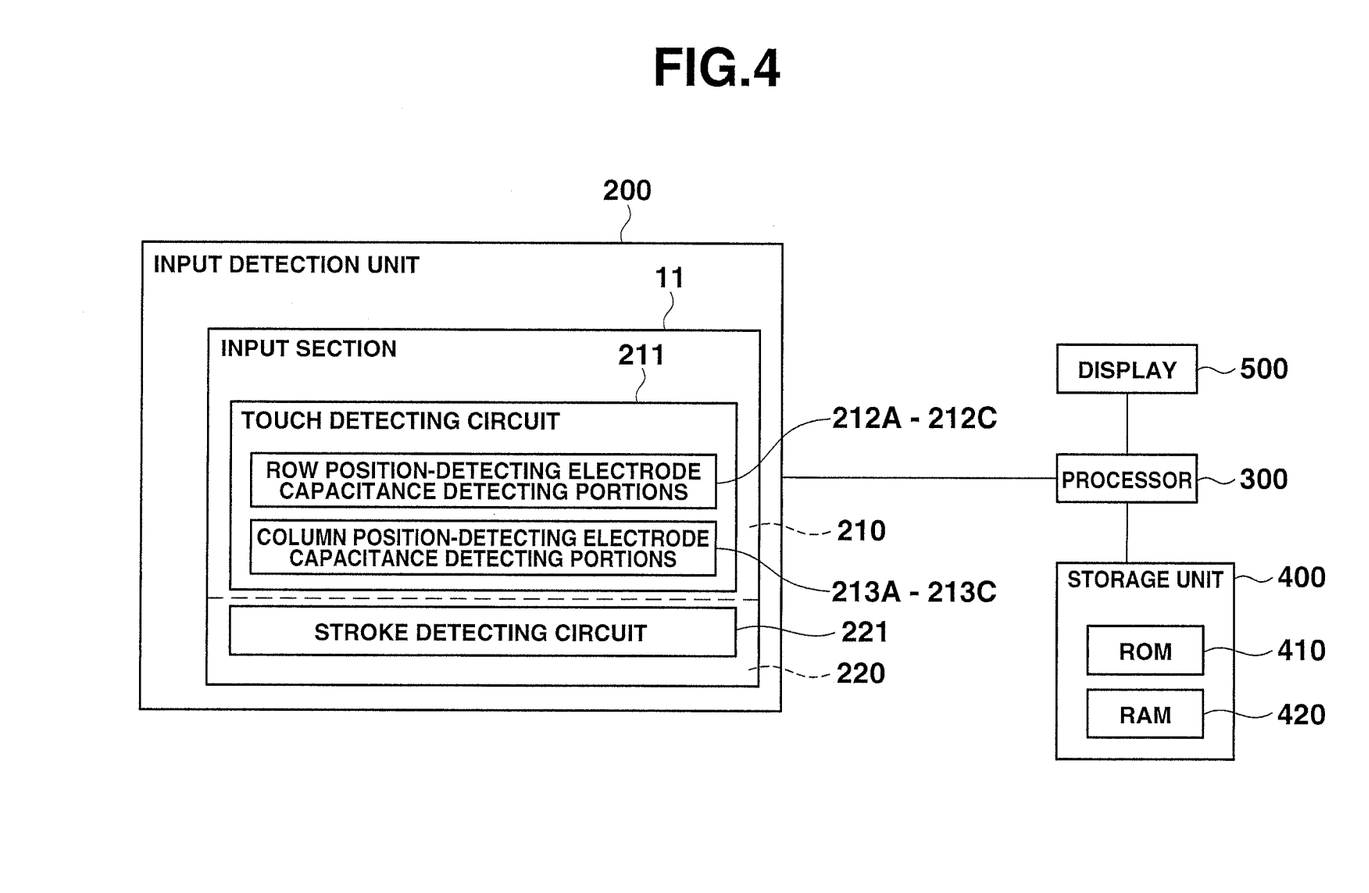
FIG. 4 is a block diagram of the electronic calculator 10 according to the embodiment of the invention.

In addition, right-side touch detection electrodes of three holes 121$h$ arranged in a row direction (the left-and-right direction in the drawing), for example, right-side touch detection electrodes 122R7, 122R8 and 122R9 of three holes 121$h$7, 121$h$8 and 121$h$9 of the uppermost row, are connected by one wiring line 123R3 in parallel to each other to a third row position-detecting electrostatic capacitance sensor 212C (see FIG. 4). Similarly, as regards the middle row, right-side touch detection electrodes 122R4, 122R5 and 122R6 of three holes 121$h$4, 121$h$5 and 121$h$6 are connected by one wiring line 123R2 in parallel to each other to a second row position-detecting electrostatic capacitance sensor 212B. The same applies to the lowermost row, and right-side touch detection electrodes 122R1, 122R2 and 122R3 of three holes 121$h$1, 121$h$2 and 121$h$3 are connected by one wiring line 123R1 in parallel to each other to a first row position-detecting electrostatic capacitance sensor 212A.

On the other hand, left-side touch detection electrodes of three holes 121$h$ arranged in a column direction (the up-and-down direction in the drawing), for example, if the rightmost column is described, left-side touch detection electrodes 122L9, 122L6 and 122L3 of three holes 121$h$9, 121$h$6 and 121$h$3, are connected by one wiring line 123L3 in parallel to each other to a third row position-detecting electrostatic capacitance sensor 213C (see FIG. 4). The same applies to the middle column and the leftmost column. Left-side touch detection electrodes 122R8, 122R5 and 122R2 of three holes 121$h$8, 121$h$5 and 121$h$2 are connected by one wiring line 123L2 in parallel to each other to a second column position-detecting electrostatic capacitance sensor 213B, and left-side touch detection electrodes 122L7, 122L4 and 122L1 of three holes 121$h$7, 121$h$4 and 121$h$1 are connected by one wiring line 123L1 in parallel to each other to a first column position-detecting electrostatic capacitance sensor 213A.

These six electrostatic capacitance sensors, namely the above-described first to third row position-detecting electrostatic capacitance sensors 212A, 212B and 212C and first to third column position-detecting electrostatic capacitance sensors 213A, 213B and 213C, are electrostatic capacitance sensors. These electrostatic capacitance sensors are mutually different, and each can independently detect a variation of an electrostatic capacitance. The six wiring lines 123R1, 123R2, 123R3, 123L1, 123L2 and 123L3 are extended to the corresponding electrostatic capacitance sensors provided in the electrostatic capacitance sensor formation section, from between the plural holes 121$h$ in the key hole formation portion via the led-out wiring formation portion.

A description is given of an operation at a touch operation detection time in the key structure of the electronic calculator 10 of the above-described embodiment. The description below is given by taking, as an example, an operation in the case in which a touch operation was executed on any one of the plural numeric keys 110, to be more specific, the numeric key [9] 110. However, the same operation applies to other numeric keys 110. In this specification, a status (first detecting status) in which a user's fingertip or the like is in contact with the numeric key 110 or the user's fingertip or the like is in close proximity to the numeric key 110 to such a position that a variation of an electrostatic capacitance is detectable by the electrostatic capacitance sensor, and in which the collar portion 112 of the numeric key 110 and the touch detection electrode 122R, 122L of the touch detection sheet 120 are in contact with each other, is defined as a status in which a touch operation was executed. At the time of this status, that is, at the touch operation detection time, the stroke displacement variation of the numeric key 110 is zero. In addition, the key structure at this time is as illustrated in part (B) of FIG. 2, and the counter-electrode 135 of the key urging sheet 130 and the stroke detection electrode 142 of the substrate 140 are spaced apart.

If a touch operation is executed on the key top 111 of the numeric key [9] 110, a variation of an electrostatic capacitance is detected by the third row position-detecting electrostatic capacitance sensor which is connected to the key top 111 of the numeric key [9] via the collar portion 112, right-side touch detection electrode 122R9 and wiring line 123R3. At the same time, a variation of an electrostatic capacitance is detected by the third column position-detecting electrostatic capacitance sensor which is connected to the key top 111 of the numeric key [9] via the collar portion 112, left-side touch detection electrode 122L9 and wiring line 123L3.

In this manner, if a touch operation is executed on any one of the plural keys 110, a variation of an electrostatic capacitance is detected by two of the six electrostatic capacitance sensors, and it can be detected which of the numeric keys 110 was touch-operated, based on the combination of two electrostatic capacitance sensors by which the variation was detected. Specifically, when the variation of the electrostatic capacitance was detected by the third row position-detecting electrostatic capacitance sensor and the third column position-detecting electrostatic capacitance sensor, the touched key can be specified by determining that the touch operation was executed on the numeric key [9] 110. In addition, when the variation of the electrostatic capacitance was detected by the third row position-detecting electrostatic capacitance sensor and the second column position-detecting electrostatic capacitance sensor, it is understood that the touch operation was executed on the numeric key [8] 110. Similarly, when the variation of the electrostatic capacitance was detected by the first row position-detecting electrostatic capacitance sensor and the first column position-detecting electrostatic capacitance sensor, it is understood that the touch operation was executed on the numeric key [1] 110. In this manner, in the present embodiment, if six wiring lines are provided, it can be determined which of the nine numeric keys [1] to [9] 110 was touched.

Next, a description is given of, by way of example, an operation in the case in which a stroke operation was executed on any one of the plural numeric keys 110, to be more specific, the numeric key [9] 110. However, the same operation applies to other numeric keys 110. In this specification, a status (second detecting status) in which a user's fingertip or the like is in contact with the numeric key 110, and in which the counter-electrode 135 of the key urging sheet 130 and the stroke detection electrode 142 of the substrate 140 are in contact with each other, is defined as a status in which a stroke operation was executed. At the time of this status, that is, at the stroke operation detection time, the stroke displacement variation of the numeric key 110 is a certain magnitude. In addition, the key structure at this time is as illustrated in part (C) of FIG. 2, and the collar portion 112 of the numeric key 110 and the touch detection electrode 122R, 122L of the touch detection sheet 120 are spaced apart.

The stroke detection electrode 142 is connected to a stroke detecting circuit (second detecting circuit) 221 (see FIG. 4) via a wiring line (not shown) on the substrate 140. If the stroke operation is executed on the numeric key [9] 110, a contact between the counter-electrode 135 of the key urging sheet 130 and the stroke detection electrode 142 of the substrate 140 is detected by the stroke detecting circuit 221. A structure that comprises the counter-electrode 135, the stroke detection electrode 142, the wiring line on the substrate 140, and the stroke detecting circuit 221 is, hereinafter, referred to as a stroke operation detector 220.

In the meantime, an intermediate status between the first detecting status at the touch operation detection time and the second detecting status at the stroke operation detection time, that is, a status in which the stroke displacement variation of the numeric key 110 is greater than zero and is less that the above-described prescribed amount, the collar portion 112 of the numeric key 110 and the touch detection electrode 122R, 122L of the touch detection sheet 120 are spaced apart, and the counter-electrode 135 of the key urging sheet 130 and the stroke detection electrode 142 of the substrate 140 are spaced apart. In this intermediate status, neither the touch operation nor the stroke operation is detected.

The electronic calculator 10 of the present embodiment has the above-described configuration. Thus, the electronic calculator 10 has such a novel configuration that both of the touch operation and stroke operation on a certain key can be detected, and, when the stroke operation on this key was detected, the detection of the touch operation by the detecting circuit for detecting the touch operation on this key is not executed.

FIG. 4 is a block diagram of the electronic calculator 10 according to the embodiment of the invention. The electronic calculator 10 includes an input detection unit 200, a processor (CPU) 300, a storage unit 400 and a display 500.

The input detection unit 200 includes the input section 11. The input detection unit 200 includes the touch operation detector 210 and the stroke operation detector 220. The touch operation detector 210 includes a touch detecting circuit 211. The touch detecting circuit 211 includes the above-described first row position-detecting electrostatic capacitance sensor 212A, second row position-detecting electrostatic capacitance sensor 212B, third row position-detecting electrostatic capacitance sensor 212C, first column position-detecting electrostatic capacitance sensor 213A, second column position-detecting electrostatic capacitance sensor 213B, and third column position-detecting electrostatic capacitance sensor 213C. The stroke operation detector 220 includes the stroke detecting circuit 221.

The processor 300 receives signals from the respective components of the electronic calculator 10, generates control signals on the basis of the received signals, transmits the control signals to the respective components, and controls the respective components by the control signals.

The storage unit 400 includes a ROM 410 in which control instructions of the electronic calculator 10 are stored, and a RAM 420. In the RAM 420, data to be displayed on the display 500 is temporarily stored, and data is temporarily developed for a calculation process by the processor 300.

The display 500 displays information such as various calculation results, based on control signals received from the processor 300.

At a touch operation detection time, in accordance with the numeric key 110 with which the user's fingertip was put in contact, or in proximity to which the user's fingertip was moved, a variation of an electrostatic capacitance is detected by one of the first to third row position-detecting electrostatic capacitance sensors 212A, 212B and 212C and one of the first to third column position-detecting electrostatic capacitance sensors 213A, 213B and 213C. According to whether the variation amount of each electrostatic capacitance is greater than a predetermined threshold or not, the touch detecting circuit 211 transmits a corresponding detection signal to the processor 300.

At a stroke operation detection time, in accordance with the numeric key 110 on which the stroke operation was executed, the stroke detecting circuit 221 transmits each corresponding detection signal to the processor 300.

Based on the detection signal received from the input detection unit 200, the processor 300 can detect the numeric key 110 on which the input operation was executed, and the kind of the operation (either the touch operation or the stroke operation) which was executed on the numeric key 110.

Figure 5:
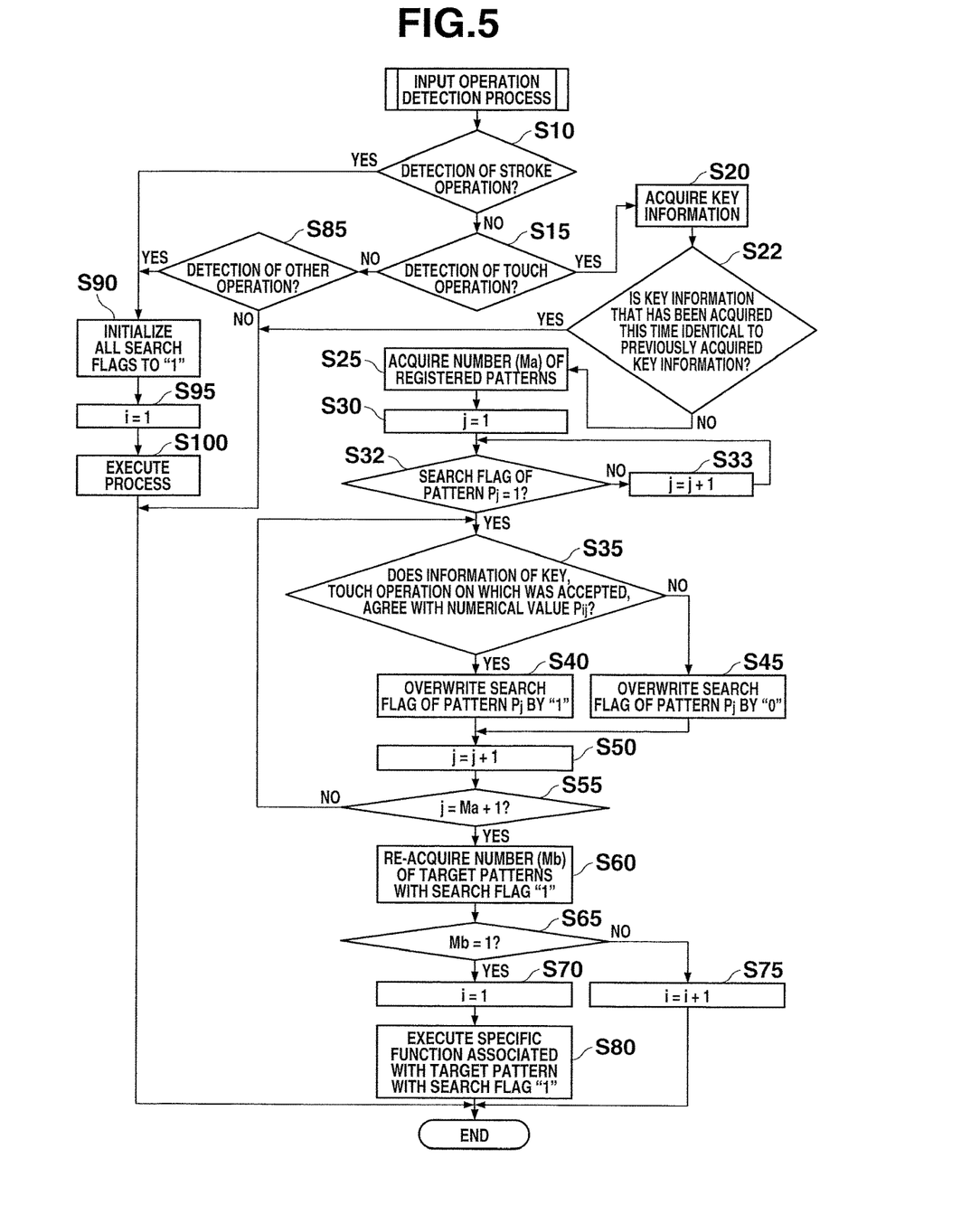
FIG. 5 is a flowchart illustrating an input operation detection process using the electronic calculator 10 according to the embodiment of the invention.
Figure 6:
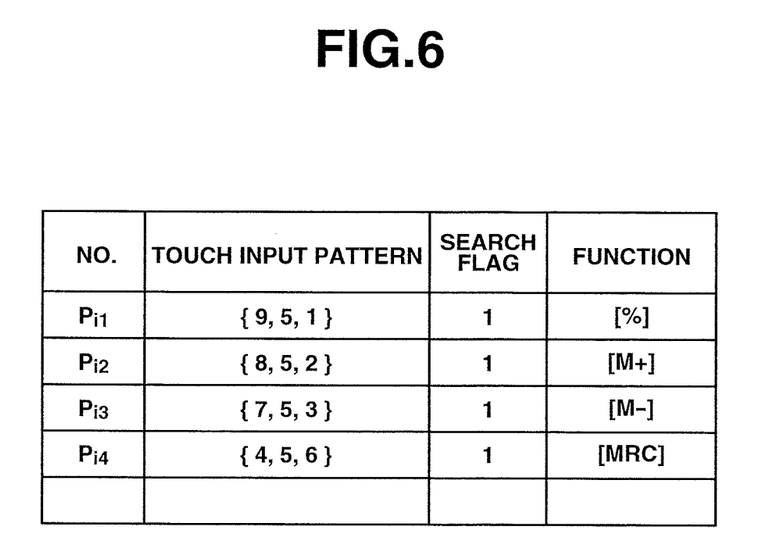
FIG. 6 illustrates a data structure of touch input patterns stored in a storage unit 400 of the electronic calculator 10 according to the embodiment of the invention.

FIG. 5 is a flowchart illustrating an input operation detection process using the electronic calculator 10 according to the embodiment of the invention. The processor 300 determines, in predetermined cycles (for example, at intervals of 10 ms), whether a detection signal corresponding to either the touch operation or the stroke operation on any one of the keys was received or not. FIG. 6 illustrates a data structure of information stored in the RAM for specifying functions corresponding to touch operations. This information includes a plurality of numerical sequences {9, 5, 1}, {8, 5, 2}, {7, 5, 3} and {4, 5, 6} as first, second, third and fourth numerical sequences Pi1~Pi4 (hereinafter referred to as "touch input patterns Pi1~Pi4"), and search flags and specific functions, which are associated with the respective numerical sequences. At the time of power-on of the electronic calculator 10, as one of initializing processes, the search flags are set to "1" for all touch input patterns, and the values of variables i and j (to be described later) are written to 1.

If a detection signal corresponding to an operation other than a touch operation is received (hereinafter, for the purpose of simple description, the wording "an operation is detected" is used), that is, if a stroke operation is detected (step S10: Yes), or if some other operation is detected (step S10: No, step S15: No, step S85: Yes), the processor 300 rewrites the search flags stored in the RAM to "1" and also rewrites the variable i to 1 (step S90, S95), and the processor 300 executes a process corresponding to the detected stroke operation or other operation (step S100). If no operation is detected (step 10: No, step S15: No, step S85: No), the present input operation detection process is terminated. Accordingly, if a stroke operation on a key other than the numeric keys [1] to [9] 110, that is, any one of the keys, a touch operation on which is undetectable (e.g. all-clear key [AC], clear key [C], etc.), is detected (step S10: Yes), a process corresponding to this stroke operation is executed by the processor 300 (step S100). Although not illustrated, in step S100, the processor 300 determines whether the accepted operation is the same as the previous detection result. If the processor 300 determines that the accepted operation is the same as the previous detection result, the processor 300 terminates the present input operation detection process without performing the corresponding process.

If the processor 300 determines that a stroke operation is not detected but a touch operation is detected (step S10: No, step S15: Yes), the processor 300 specifies, based on the detection signal, the numeric key on which the touch operation was executed (step S20). At this time, the same numerical value as the number printed on the key top 111 of this numeric key 110 is acquired as key information. The processor 300 determines whether the key information acquired this time is identical to the previously acquired key information (step S22). If the key information acquired this time is identical to the previously acquired key information, the processor 300 terminates the present input operation detection process (step S22: Yes). If the key information acquired this time is different from the previously acquired key information (step S22: No), the processor 300 then determines whether this key information is one of some predetermined keys.

Specifically, the processor 300 first acquires a number Ma of registered touch input patterns (step S25) and initializes the variable j (step S30), and then determines whether the search flag is "1" or not, in the order beginning from the first touch input pattern (step S32). If the search flag is "1" (step S32: Yes), the processor 300 determines whether the key information acquired in step S20 is equal to a numerical value Pij of an i-th digit of a j-th pattern from the first one of the touch input patterns stored in the RAM (step S35). If the key information agrees with the numerical value Pij (step S35: Yes), the search flag of the j-th pattern is rewritten to "1" (step S40). If the key information disagrees with the numerical value Pij (step S35: No), the search flag is rewritten to "0"(step S45). If the search flag is not "1" in step S32 (step S32: No), the processor 300 increments the variable j (step S33) and transitions to a determination process of the search flag of the next touch input pattern (step S32).

The processor 300 repeats the determination process (step S35) of one or more touch input patterns stored in the RAM and the rewrite process (step S40, S45) of the search flag (step S50, step S55: No). If the processor 300 finishes the processes of all (Ma) touch input patterns (step S50, step S55: Yes), the processor 300 acquires a number Mb of touch input patterns with the search flag "1". If the number Mb is equal to 1 (step S65: Yes), the processor 300 executes a specific function which is stored in the RAM in association with the touch input pattern with the search flag "1"(step S80). If the number Mb is not equal to 1 (step S65: No), the processor 300 increments the variable i (step S75) and terminates the present process.

The above-described input operation detection process is summarized. If the order of touch-operated keys is equal to a pre-registered touch input pattern (step S10: No, S15: Yes, S20, S25, S30, S35: Yes/No, S40, S45, S50, S55: Yes/No, S60, S65: Yes/No, S70, S75), the processor 300 executes the specific function corresponding to this pattern (step S80). If an operation other than the touch operation, that is, a stroke operation or other operation, is executed before the order of touch-operated keys becomes equal to a pre-registered touch input pattern (step S10: Yes/No, S15: No, step S85: Yes), the processor 300 initializes the variable for touch input pattern detection (step S90, S95), and executes the process associated with this operation (step S100).

Figure 7:
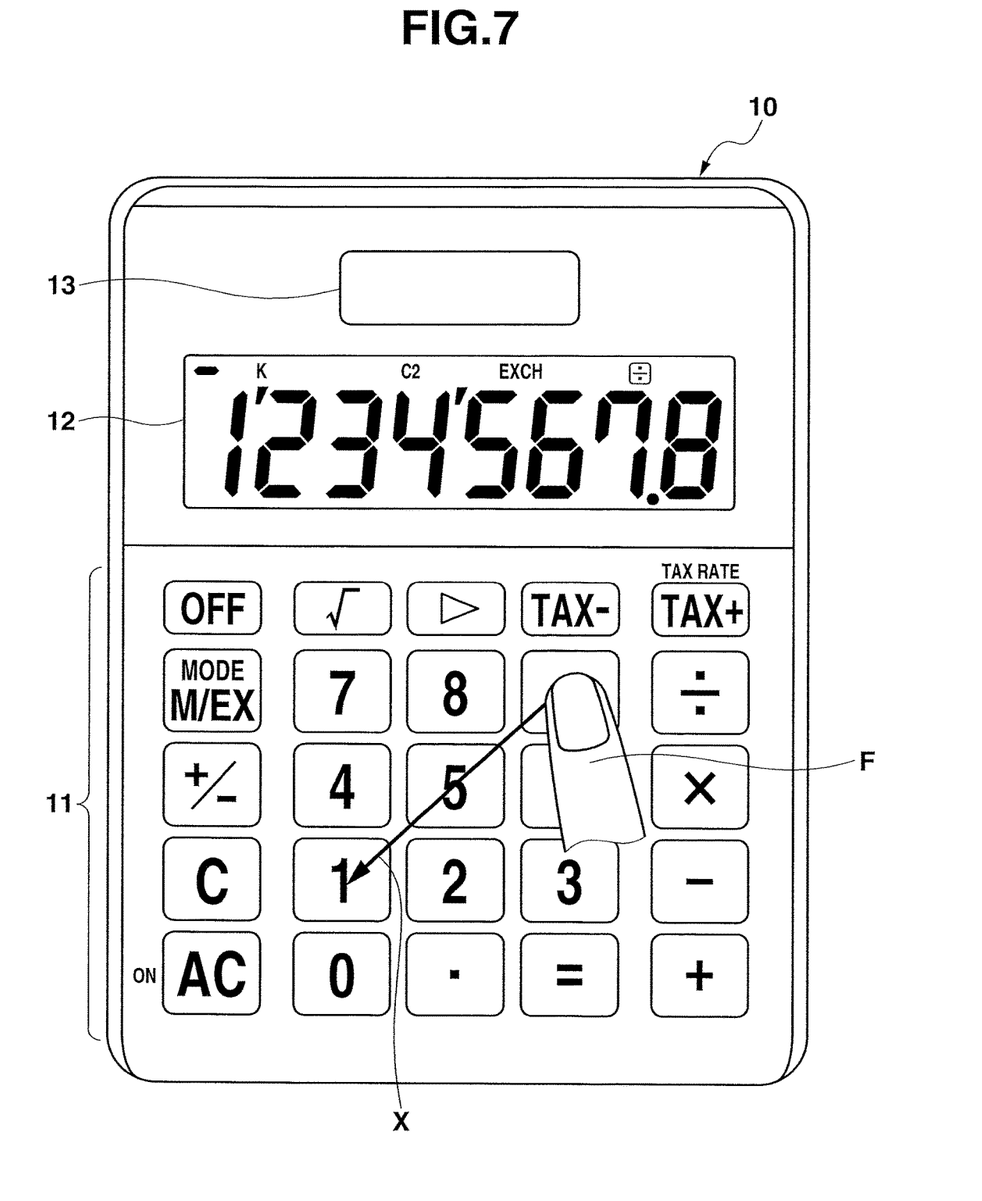
FIG. 7 is a view illustrating an example of a user operation using the electronic calculator 10 according to the embodiment of the invention.

A further description is given based on touch input patterns of concrete examples, which are stored in the RAM. FIG. 7 is a view illustrating an example of a user operation on the input section 11 of the electronic calculator 10. A first touch input pattern is {9, 5, 1}. This pattern corresponds to an input operation of sliding a finger in a straight line from the upper right to lower left over a substantially rectangular area in which the numeric keys [1] to [9] 110 are arranged. This touch input pattern is associated with a function of calculating a percentage with a numerical value displayed on the display 12. Similarly, a second touch input pattern is {8, 5, 2}. This pattern corresponds to an input operation of sliding a finger from above to below over the substantially rectangular area. This second touch input pattern is associated with the same function as an [M+] key. A third touch input pattern is {7, 5, 3}. This pattern corresponds to an input operation of sliding a finger from the upper left to lower right over the substantially rectangular area. This third touch input pattern is associated with the same function as an [M−] key. A fourth touch input pattern is {4, 5, 6}. This pattern corresponds to an input operation of sliding a finger from the left to right over the substantially rectangular area. This fourth touch input pattern is associated with the same function as an [MRC] key.

It is now assumed that a touch operation was detected in the initial state, that is, in the state in which all search flags are "1" and the variable i is 1. If the touched numeric key 110 is any one of [9], [8], [7] and [4], the search flag of the touch input pattern corresponding to this numeric key is rewritten to "1". Specifically, if the touched numeric key 110 is [9], the search flag of the first touch input pattern {9, 5, 1} is rewritten to "1" and the search flags of the second to fourth touch input patterns are rewritten to "0". Next, it is assumed that a touch operation was detected before a stroke operation or other operation is detected. In this case, if the touched numeric key 110 is not [5], the search flag of the first touch input pattern {9, 5, 1} is rewritten to "0". On the other hand, if the touched numeric key 110 is [5], the value of the search flag of the first touch input pattern {9, 5, 1} is unchanged. Next, it is assumed that a touch operation on the numeric key [1] 110 was detected before a stroke operation or other operation is detected. In this case, since the touch input pattern agrees with the first touch input pattern {9, 5, 1}, the processor 300 executes the function of calculating a percentage, which is the specific function associated with the first touch input pattern.

Thereby, in the electronic calculator 10 of the present embodiment, the functions corresponding to at least four keys [M+], [M−], [MRC] and [%] can be executed by touch operations, without providing these keys. Therefore, the input section 11 and the electronic calculator 10 can be reduced in size. In the meantime, the touch input patterns are not limited to straight-line-shaped input operations, and may include various patterns such as "[7]→[4]→[1]→[2]→[3]"

(L-shaped input operation) and "[7]→[4]→[1]→[2]→[3]→[6]→[9]" (U-shaped input operation). By associating such touch input patterns with functions of other keys, the functions corresponding to a greater number of keys can be executed by touch operations, without providing these keys.

[First Modification]

Figure 8:
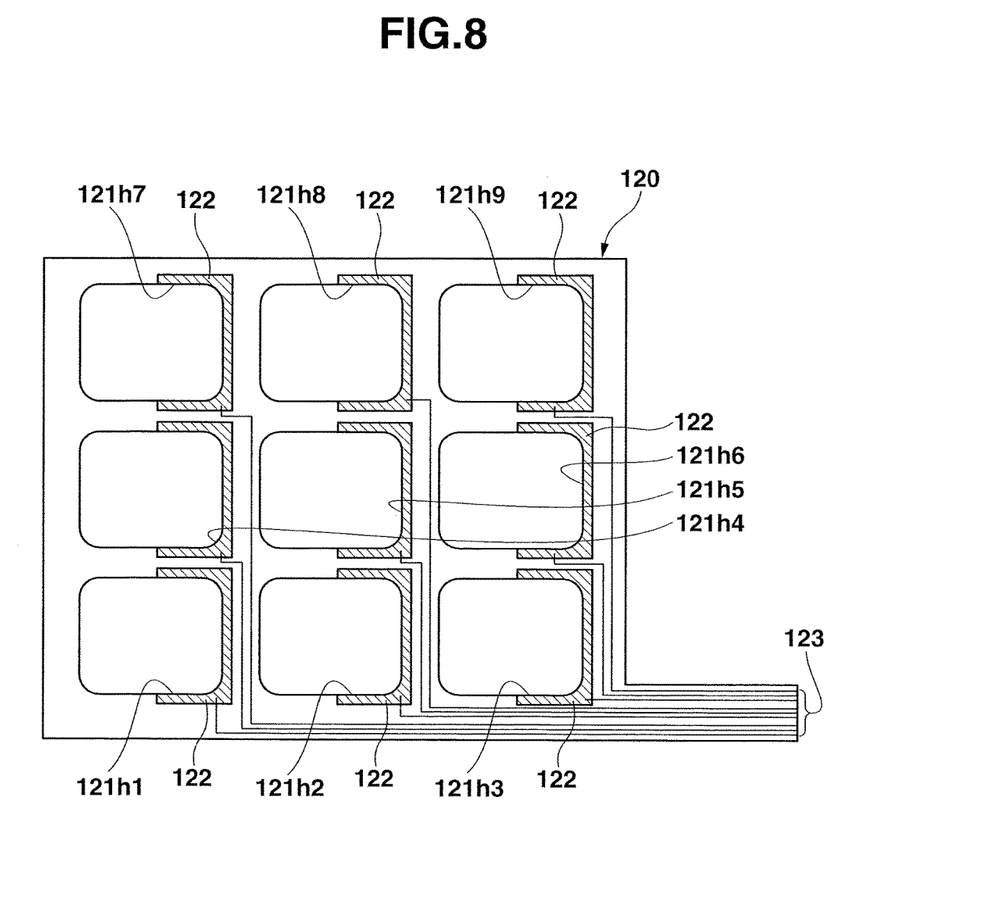
FIG. 8 is a transparent plan view illustrating a conductor pattern on a touch detection sheet 120 of an electronic calculator 10A according to a first modification of the invention.

FIG. 8 is a transparent plan view illustrating touch detection electrodes 122 and wiring lines 123 in a conductor pattern on a touch detection sheet 120A of an electronic calculator 10A according to a first modification of the invention. The same structural components as in the above-described embodiment are denoted by identical or similar reference numerals, and a description thereof is omitted for the purpose of simple description. In the present modification, only one touch detection electrode 122 is provided at a peripheral edge of each hole 121h provided in the touch detection sheet 120A. In addition, one wiring line 123 is connected to each touch detection electrode 122. Each wiring line 123 is connected to any one of nine electrostatic capacitance sensors (not shown) which can mutually independently detect variations of electrostatic capacitances. If a touch operation is executed on any one of the key tops 111 of the numeric keys [1] to [9] 110, a variation of an electrostatic capacitance is detected by one of the electrostatic capacitance sensors for detection, which is connected to the key top 111 via the collar portion 112 of the numeric key 110, one corresponding touch detection electrode 122 and one corresponding wiring line 123.

In this manner, in the first modification, the number of electrodes, which are formed in a touch electrode formation portion that is a region where the touch detection electrodes 122 are formed in the touch detection sheet 120A, and the number of wiring lines extending to these electrodes, can be reduced compared to the above-described embodiment. Thereby, like the above embodiment, the electronic calculator 10A of this modification has such a novel configuration that both of the touch operation and stroke operation on a certain key can be detected, and, when the stroke operation on this key was detected, the detection of the touch operation by the detecting circuit for detecting the touch operation on this key is not executed. Moreover, the touch electrode formation portion of the touch detection sheet 120A can be reduced in size, and the degree of freedom of design can be enhanced when the electrodes and the wiring lines extending to the electrodes are formed on the touch electrode formation portion.

[Second Modification]

Figure 9:
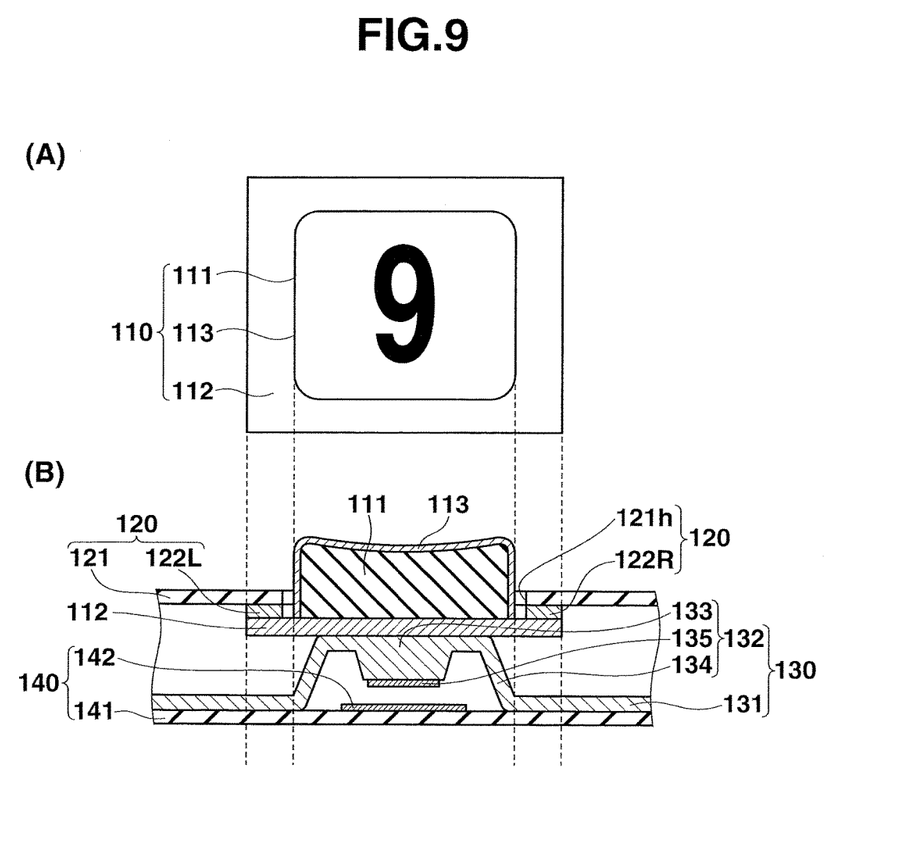
FIG. 9 is a cross-sectional view corresponding a II-II cross-sectional view of an electronic calculator 10B according to a second modification of the invention, part (A) of FIG. 9 being a plan view of a numeric key 110, and part (B) of FIG. 9 being a II-II cross-sectional view illustrating a key structure of the numeric key 110 at a touch operation detection time.

FIG. 9 is a cross-sectional view corresponding a II-II cross-sectional view of an electronic calculator 10B according to a second modification of the invention. Part (A) of FIG. 9 is a plan view of a numeric key 110, and part (B) of FIG. 9 is a II-II cross-sectional view illustrating a key structure of the numeric key 110 at a touch operation detection time. The same structural components as in the above-described embodiment are denoted by identical or similar reference numerals, and a description thereof is omitted for the purpose of simple description. In the present modification, an insulation film 13 is formed by an insulative resin being coated in a manner to cover the entirety of the key top 111 of the numeric key 110. This insulation film 113 may be, for example, a resin ink which is coated in order to impart a desired color to the surface of the key top 111, If a touch operation is executed on any one of the key tops 111 of the numeric keys [1] to [9] 110, a variation of an electrostatic capacitance is detected by two of the electrostatic capacitance sensors for detection, which are connected to the key top 111 via the collar portion 112 of the numeric key 110, two corresponding touch detection electrode 122R and 122L and two corresponding wiring line 123R3 and 123L3. It can be detected which of the numeric keys 110 was touch-operated, based on the combination of the two electrostatic capacitance sensors by which the variation was detected. If the thickness of the insulation film 113 is large, the variation amount of the electrostatic capacitance, which is detected by the electrostatic capacitance sensors for detection, decreases, and the sensitivity of the touch detecting circuit 211 lowers. It is thus necessary to properly design the thickness so that a proper detection sensitivity can be obtained while a desired color can be imparted. Besides, the insulation film 113 does not need to impart a color. The insulation film 113 may be visually transparent or semitransparent, or may bring about a desired visual or tactual effect by imparting glossness or roughness.

As described above, like the above embodiment, the electronic calculator 10B of this second modification has such a novel configuration that both of the touch operation and stroke operation on a certain key can be detected, and, when the stroke operation on this key was detected, the detection of the touch operation by the detecting circuit for detecting the touch operation on this key is not executed. Moreover, a desired color can be imparted to the key top 111. Needless to say, the second modification is applicable, not only to the case in which two touch detection electrodes 122R and 122L are provided to the peripheral edge of each hole 121h of the numeric keys [1] to [9] 110, as described above, but also to the case in which only one touch detection electrode 122 is provided to the peripheral edge of each hole 121h of the numeric keys [1] to [9] 110, as in the above-described first modification.

The present invention is not limited to the above-described embodiments. In practice, various modifications may be made without departing from the spirit of the invention. In addition, the embodiments include inventions in various stages, and various inventions can be derived from proper combinations of structural elements disclosed herein. For example, even if some structural elements are omitted from all the structural elements disclosed in the embodiments or some structural elements are combined in other forms, if the problem described in this specification can be solved and the advantageous effects described in this specification can be achieved, the structure, from which such structural elements are omitted or in which such structural elements are combined, can be derived as an invention.

While various embodiments have been described herein above, it is to be appreciated that various changes in form and detail may be made without departing from the spirit and scope of the invention(s) presently or hereafter claimed.

What is claimed is:

1. A key input apparatus sensing touch and pressure, the key apparatus comprising:
   a key that is displaceable along a direction;
   a first detecting circuit that comprises an electrostatic capacitance sensor that detects a variation of an electrostatic capacitance caused by a contact or a proximity of a pressing body with the key; and
   a second detecting circuit that comprises a first electrode, the second detecting circuit detecting an electric connection of the first electrode to a second electrode that is displaced along the direction as the key is displaced,
   wherein the key input apparatus switches a detecting status thereof exclusively between a first detecting status and a second detecting status to each other in accordance with a displacement variation of the key, the first detecting status being a status where the variation of the electrostatic capacitance is detected by the first detecting circuit and, at the same time, the electric connection is not detected by the second detecting circuit, and the second detecting status being a status where the variation of the electrostatic capacitance is not detected by the first detecting circuit and, at the same time, the electric connection is detected by the second detecting circuit, wherein the key comprises a collar portion, the collar portion comprising a first conductive portion which is electrically conductive, with which the pressing body is put in contact from an outside of the key input apparatus, or in proximity to which the pressing body is moved from the outside of the key input apparatus, and a second conductive portion which is electrically conductive and is electrically connected to the first conductive portion, and wherein the key input apparatus further comprises:
a panel provided with a hole in which the key is fitted from a back surface side; and
a third conductive portion provided on a back surface of the panel, the third conductive portion being configured such that, in the first detecting status, the electrostatic capacitance sensor detects the variation of the electrostatic capacitance by the pressing body while the third conductive portion is electrically connected to the collar portion.

2. The key input apparatus according to claim 1, wherein the key further comprises an insulation layer provided on a surface of the key, and
wherein the pressing body and the first conductive portion come in proximity via the insulation layer in a state in which the pressing body is in contact with the insulation layer.

3. The key input apparatus according to claim 1, wherein a plurality of the keys are arranged two-dimensionally in a row direction and a column direction,
wherein the first detecting circuit comprises:
a row position sensor configured such that, of the keys, at least two first keys that are arranged in the row direction comprise at least two pairs of conductive portions, each of the pairs of conductive portions comprises a one-side conductive portion, and at least two said one-side conductive portions are connected in parallel to each other; and
a column position sensor configured such that, of the keys, at least two second keys that are arranged in the column direction comprise at least two pairs of conductive portions, each of the pairs of conductive portions comprises a one-side conductive portion, and at least two said one-side conductive portions are connected in parallel to each other, and
wherein the first detecting circuit specifies the key, among the keys, with which the pressing body is put in contact or in proximity to which the pressing body is moved, based on a row position detected by the row position sensor and a column position detected by the column position sensor.

4. The key input apparatus according to claim 3, wherein:
the third conductive portion comprises a pair of conductive portions that are provided at a peripheral edge of the hole and are spaced apart from each other,
the electrostatic capacitance sensor of the first detecting circuit comprises a first electrostatic capacitance sensor and a second electrostatic sensor which are different from each other, the one-side conductive portion of the pair of conductive portions is connected to the first electrostatic capacitance sensor, and an other-side conductive portion of the pair of the conductive portions is connected to the second electrostatic capacitance sensor, and
the collar portion is connected to the pair of conductive portions in the first detecting status, and thereby the pressing body and the first electrostatic capacitance sensor are electrically connected via the one-side conductive portion, and the pressing body and the second electrostatic capacitance sensor are electrically connected via the other-side conductive portion.

5. The key input apparatus according to claim 1, wherein a plurality of the keys are arranged two-dimensionally in a row direction and a column direction,
wherein the first detecting circuit comprises a plurality of position sensors to which the third conductive portions of the keys are connected in a one-to-one correspondence, and
wherein the first detecting circuit specifies the key, among the plurality of keys, with which the pressing body is put in contact or in proximity to which the pressing body is moved, based on positions detected by the position sensors.

6. The key input apparatus according to claim 5, wherein:
the panel is provided with a plurality of holes in which the keys are fitted,
the third conductive portions comprise conductive portions that are provided at peripheral edges of the holes,
the electrostatic capacitance sensor of the first detecting circuit comprises a first electrostatic capacitance sensor and a second electrostatic sensor which are different from each other,
one conductive portion of the third conductive portions, which corresponds to one key of the keys, is connected to the first electrostatic capacitance sensor, and another conductive portion of the third conductive portions, which corresponds to another key of the keys, is connected to the second electrostatic capacitance sensor, and
the collar portion is connected to the one conductive portion when the one key is in the first detecting status, and thereby the pressing body and the first electrostatic capacitance sensor are electrically connected via the one conductive portion, and the collar portion is connected to the another conductive portion when the another key is in the first detecting status, and thereby the pressing body and the second electrostatic capacitance sensor are electrically connected via the another conductive portion.

7. The key input apparatus according to claim 1, further comprising a processor that executes at least one function in accordance with detection results by the first detecting circuit and the second detecting circuit,
wherein:
a plurality of the keys are provided,
the processor executes a first function when the first detecting circuit has detected that the pressing body is in contact with, or in proximity to, any one of the keys,
the processor executes a second function which is different from the first function, when the second detecting circuit has detected that the first electrode and the second electrode of the key are electrically connected, and
the processor executes a third function which is different from the first function and the second function, when the first detecting circuit has detected that the pressing body has continuously come in contact with, or in proximity to, at least two keys of the keys.

8. A key input apparatus sensing touch and pressure, the key input apparatus comprising:
a key that is displaceable along a direction;
a first detecting circuit that comprises an electrostatic capacitance sensor that detects a variation of an electrostatic capacitance caused by a contact or a proximity of a pressing body with the key; and
a second detecting circuit that comprises a first electrode, the second detecting circuit detecting an electric connection of the first electrode to a second electrode that is displaced along the direction as the key is displaced,
wherein the key input apparatus switches a detecting status thereof exclusively between a first detecting status and a second detecting status to each other in accordance with a displacement variation of the key, the first detecting status being a status where the variation of the electrostatic capacitance is detected by the first detecting circuit and, at the same time, the electric connection is not detected by the second detecting circuit, and the second detecting status being a status where the variation of the electrostatic capacitance is not detected by the first detecting circuit and, at the same time, the electric connection is detected by the second detecting circuit, and
wherein, in accordance with the displacement variation of the key, the first detecting status and an intermediate status switches exclusively to each other, and the intermediate status and the second detecting status switches exclusively to each other, the intermediate status being a status where the variation of the electrostatic capacitance is not detected by the first detecting circuit and, at a same time, the electric connection is not detected by the second detecting circuit.

9. The key input apparatus according to claim 8, further comprising a processor that executes at least one function in accordance with detection results by the first detecting circuit and the second detecting circuit,
wherein:
a plurality of the keys are provided,
the processor executes a first function when the first detecting circuit has detected that the pressing body is in contact with, or in proximity to, any one of the keys,
the processor executes a second function which is different from the first function, when the second detecting circuit has detected that the first electrode and the second electrode of the key are electrically connected, and
the processor executes a third function which is different from the first function and the second function, when the first detecting circuit has detected that the pressing body has continuously come in contact with, or in proximity to, at least two keys of the keys.

10. An electronic apparatus comprising:
a key input apparatus sensing touch and pressure; and
a processor,
wherein the key input apparatus comprises:
a key that is displaceable along a direction;
a first detecting circuit that comprises an electrostatic capacitance sensor that detects a variation of an electrostatic capacitance caused by a contact or a proximity of a pressing body with the key; and
a second detecting circuit that comprises a first electrode, the second detecting circuit detecting an electric connection of the first electrode to a second electrode that is displaced along the direction as the key is displaced,
wherein the key input apparatus switches a detecting status thereof exclusively between a first detecting status and a second detecting status to each other in accordance with a displacement variation of the key, the first detecting status being a status where the variation of the electrostatic capacitance is detected by the first detecting circuit and, at the same time, the electric connection is not detected by the second detecting circuit, and the second detecting status being a status where the variation of the electrostatic capacitance is not detected by the first detecting circuit and, at the same time, the electric connection is detected by the second detecting circuit,
wherein the processor executes at least one function in accordance with detection results by the first detecting circuit and the second detecting circuit, and
wherein, in accordance with the displacement variation of the key, the first detecting status and an intermediate status switches exclusively to each other, and the intermediate status and the second detecting status switches exclusively to each other, the intermediate status being a status where the variation of the electrostatic capacitance is not detected by the first detecting circuit and, at the same time, the electric connection is not detected by the second detecting circuit.

11. An electronic apparatus comprising:
a key input apparatus sensing touch and pressure; and
a processor,
wherein the key input apparatus comprises:
a key that is displaceable along a direction;
a first detecting circuit that comprises an electrostatic capacitance sensor that detects a variation of an electrostatic capacitance caused by a contact or a proximity of a pressing body with the key; and
a second detecting circuit that comprises a first electrode, the second detecting circuit detecting an electric connection of the first electrode to a second electrode that is displaced along the direction as the key is displaced,
wherein the key input apparatus switches a detecting status thereof exclusively between a first detecting status and a second detecting status to each other in accordance with a displacement variation of the key, the first detecting status being a status where the variation of the electrostatic capacitance is detected by the first detecting circuit and, at the same time, the electric connection is not detected by the second detecting circuit, and the second detecting status being a status where the variation of the electrostatic capacitance is not detected by the first detecting circuit and, at the same time, the electric connection is detected by the second detecting circuit,
wherein the processor executes at least one function in accordance with detection results by the first detecting circuit and the second detecting circuit,
wherein the key comprises a collar portion, the collar portion comprising a first conductive portion which is electrically conductive, with which the pressing body is put in contact from an outside of the key input apparatus, or in proximity to which the pressing body is moved from the outside of the key input apparatus, and a second conductive portion which is electrically conductive and is electrically connected to the first conductive portion, and wherein the key input apparatus further comprises:
   a panel provided with a hole in which the key is fitted from a back surface side; and
   a third conductive portion provided on a back surface of the panel, third conductive portion being configured such that, in the first detecting status, the electrostatic capacitance sensor detects the variation of the electrostatic capacitance by the pressing body while the third conductive portion is electrically connected to the collar portion.

* * * * *